(12) United States Patent
Oruganti et al.

(10) Patent No.: US 10,430,302 B2
(45) Date of Patent: Oct. 1, 2019

(54) DATA RETENTION WITH DATA MIGRATION

(71) Applicant: QUALCOMM Incorporated, San Diego, CA (US)

(72) Inventors: Kalyan Kumar Oruganti, Vijayawada (IN); Kailash Digari, Bangalore (IN); Sandeep Nellikatte Srivatsa, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 238 days.

(21) Appl. No.: 15/486,164

(22) Filed: Apr. 12, 2017

(65) Prior Publication Data

US 2018/0300208 A1 Oct. 18, 2018

(51) Int. Cl.
*G06F 11/00* (2006.01)
*G06F 11/16* (2006.01)
(Continued)

(52) U.S. Cl.
CPC .......... *G06F 11/1666* (2013.01); *G06F 1/263* (2013.01); *G06F 1/28* (2013.01); *G06F 1/3243* (2013.01); *G06F 1/3275* (2013.01); *G06F 1/3287* (2013.01); *G06F 3/064* (2013.01); *G06F 3/0619* (2013.01); *G06F 3/0647* (2013.01); *G06F 3/0683* (2013.01); *G06F 9/46* (2013.01);
(Continued)

(58) Field of Classification Search
CPC ........ G06F 11/1666; G06F 1/263; G06F 1/28; G06F 1/3243; G06F 1/3275; G06F 3/0619
See application file for complete search history.

(56) References Cited

U.S. PATENT DOCUMENTS 6,732,241 B2 * 5/2004 Riedel ................... G06F 1/3225
711/154
7,154,297 B1 * 12/2006 Camarota .......... H03K 19/1776
326/40
(Continued)

OTHER PUBLICATIONS

International Search Report and Written Opinion—PCT/US2018/019714—ISA/EPO—dated Apr. 30, 2018.
(Continued)

*Primary Examiner* — Esaw T Abraham
(74) *Attorney, Agent, or Firm* — Colby Nipper / Qualcomm

(57) ABSTRACT

An integrated circuit is disclosed for data retention with data migration. In an example aspect, the integrated circuit includes a logic block, a memory block, and retention control circuitry coupled to the logic and memory blocks. The logic block includes multiple retention-relevant storage devices to store first data and second data. The multiple retention-relevant storage devices include a first group of retention-relevant storage devices to store the first data and a second group of retention-relevant storage devices to store the second data. The memory block maintains memory data in the memory block during a retention operational mode. The retention control circuitry causes the retention-relevant storage devices of the second group to be activated into multiple scan chains and also migrates the second data between the second group and the memory block using the multiple scan chains to accommodate transitions between the retention operational mode and a regular operational mode.

25 Claims, 10 Drawing Sheets

(51) Int. Cl.
    *G06F 1/26*     (2006.01)
    *G06F 1/28*     (2006.01)
    *G06F 3/06*     (2006.01)
    *G06F 11/20*     (2006.01)
    *G06F 1/3234*     (2019.01)
    *G11C 11/00*     (2006.01)
    *G11C 14/00*     (2006.01)
    *G11C 29/32*     (2006.01)
    *G06F 1/3287*     (2019.01)
    *G06F 9/46*     (2006.01)
    *G11C 5/14*     (2006.01)
    *G06F 12/0868*     (2016.01)

(52) U.S. Cl.
    CPC ........ G06F 11/2094 (2013.01); G11C 11/005 (2013.01); G11C 14/00 (2013.01); G11C 29/32 (2013.01); *G06F 12/0868* (2013.01); *G06F 2201/85* (2013.01); *G06F 2212/1041* (2013.01); *G06F 2212/205* (2013.01); *G11C 5/14* (2013.01); *Y02D 10/14* (2018.01)

(56) References Cited

U.S. PATENT DOCUMENTS

| | | | | |
|---|---|---|---|---|
| 7,340,616 | B2* | 3/2008 | Rothman | G06F 1/3221 713/300 |
| 7,639,056 | B2* | 12/2009 | Gururajarao | H03K 3/356008 327/202 |
| 8,289,060 | B2* | 10/2012 | Tower | H03K 3/0375 327/215 |
| 8,363,504 | B2 | 1/2013 | Priel et al. | |
| 8,477,522 | B2* | 7/2013 | Clinton | G11C 11/221 365/145 |
| 8,988,123 | B2 | 3/2015 | Yang et al. | |
| 9,058,126 | B2* | 6/2015 | Bartling | G06F 13/00 |
| 9,430,481 | B2* | 8/2016 | Archer | G06F 11/36 |
| 9,473,113 | B1 | 10/2016 | Pant et al. | |
| 9,594,421 | B2* | 3/2017 | Rossi | G06F 1/3268 |
| 9,632,888 | B2* | 4/2017 | Sun | G06F 11/14 |
| 2006/0152267 | A1* | 7/2006 | Ramprasad | H03K 3/356 327/208 |
| 2007/0150780 | A1 | 6/2007 | Shimooka | |
| 2010/0017632 | A1* | 1/2010 | Cooper | G06F 1/3221 713/320 |
| 2014/0075175 | A1 | 3/2014 | Bartling et al. | |
| 2015/0339435 | A1 | 11/2015 | Greenberg et al. | |
| 2016/0049937 | A1 | 2/2016 | Tong et al. | |
| 2016/0232968 | A1 | 8/2016 | August et al. | |

OTHER PUBLICATIONS

Greenberg S., et al., "Selective State Retention Power Gating Based on Formal Verification", IEEE Transactions on Circuits and Systems—I, Regular Papers, vol. 62, No. 3, Mar. 2015, pp. 807-815.

* cited by examiner

DATA RETENTION WITH DATA MIGRATION

TECHNICAL FIELD

This disclosure relates generally to power management with integrated circuits (ICs) that are used in electronic devices and, more specifically, to retaining data for a logic block that is to undergo a power collapse by migrating the data to a memory block that is capable of maintaining the data during a power collapse event.

BACKGROUND

Power consumption by electronic devices is an increasingly important factor in the design of electronic devices. From a global perspective, the energy consumption of electronic devices occupies a sizable percentage of total energy usage due to large corporate data centers and the ubiquity of personal computing devices. Environmental concerns thus motivate efforts to reduce the power consumed by electronic devices to help conserve the earth's resources. From an individual perspective, less power consumption translates to lower energy bills. Furthermore, many personal computing devices are portable and powered by batteries. The less energy that is consumed by a portable battery-powered electronic device, the longer the portable device may operate without recharging the battery. Lower energy consumption also enables the use of smaller batteries and the adoption of thinner form factors, which means electronic devices can be made more portable or versatile. Thus, the popularity of portable devices also motivates efforts to reduce the power consumption of electronic devices.

An electronic device consumes power if the device is coupled to a power source and is turned on. This is true for the entire electronic device, but it is also true for individual parts of the electronic device. Hence, power consumption can be reduced if parts of an electronic device are powered down, even while other parts remain powered up. Entire discrete components of an electronic device, such as a whole integrated circuit (IC) or a Wi-Fi radio, may be powered down. Alternatively, selected parts of a discrete component may likewise be powered down. For example, a distinct processing entity or other circuit block of an integrated circuit chip, such as a core thereof, may be selectively powered down for some period of time to reduce energy consumption.

A portion of an integrated circuit, such as a core, can therefore be powered down to reduce power usage and extend battery life. A core can be powered down by decoupling the core from a power source or by turning the power source off. Additionally, a core can be powered down by lowering a voltage supplied to the core to reduce power consumption. Powering down an integrated circuit portion is referred to herein as a "power collapse," a "power collapse event," or as creating a "power collapse period."

Unfortunately, implementing a power collapse with an integrated circuit core can create problems. For example, resuming a computing task after a core is powered down takes time, which slows performance and can adversely impact a user experience. Moreover, functional data, which includes data being used for an ongoing computing task, may be lost if power is removed from certain types of computer memory. Losing functional data forces an application to restart or can even permanently damage user files, such as documents or pictures. Consequently, conserving energy using power collapse events is made more difficult because of the risks to functional data that arise from powering down a core of an integrated circuit.

SUMMARY

In an example aspect, an integrated circuit for data retention with data migration is disclosed. The integrated circuit includes a logic block, a memory block, and retention control circuitry. The logic block includes multiple retention-relevant storage devices configured to store first data and second data. The multiple retention-relevant storage devices include a first group of retention-relevant storage devices that include retention storage devices configured to store the first data and to retain the first data during a retention operational mode. The multiple retention-relevant storage devices also include a second group of retention-relevant storage devices configured to store the second data. The memory block is configured to maintain memory data in the memory block during the retention operational mode. The retention control circuitry is coupled to the logic block and the memory block. The retention control circuitry is configured to migrate the second data from the second group of the retention-relevant storage devices of the logic block to the memory block for the retention operational mode. The retention control circuitry is also configured to migrate the second data from the memory block to the second group of the retention-relevant storage devices for a regular operational mode.

In an example aspect, an integrated circuit is disclosed. The integrated circuit includes a logic block having multiple retention-relevant storage devices, with the multiple retention-relevant storage devices configured to store first data and second data. The multiple retention-relevant storage devices include a first group of retention-relevant storage devices, with the first group of the retention-relevant storage devices including retention storage devices configured to store the first data and to retain the first data during a retention operational mode. The multiple retention-relevant storage devices also include a second group of retention-relevant storage devices configured to store the second data. The integrated circuit also includes a memory block configured to maintain memory data in the memory block during the retention operational mode. The integrated circuit further includes retention control means for migrating the second data between the second group of the retention-relevant storage devices and the memory block to accommodate transitions between the retention operational mode and a regular operational mode.

In an example aspect, a method for data retention with data migration is disclosed. The method includes providing power to a logic block during a regular operational mode, with the logic block including a first retention-relevant storage device and a second retention-relevant storage device. The method also includes migrating second data from the second retention-relevant storage device to a memory block responsive to a retention signal being asserted. The power is removed from the logic block for a retention operational mode after the migrating of the second data to the memory block. The method additionally includes retaining first data at the first retention-relevant storage device during the retention operational mode responsive to the retention signal being asserted. The method further includes restoring the power to the logic block for the regular operational mode. After the power is restored, the method continues by migrating the second data from the memory block to the second retention-relevant storage device responsive to the retention signal being de-asserted.

In an example aspect, an integrated circuit is disclosed. The integrated circuit includes a logic block, a memory block, and retention control circuitry. The logic block includes multiple retention-relevant flip-flops, with the multiple retention-relevant flip-flops configured to store first data and second data. The multiple retention-relevant flip-flops include a first group of retention-relevant flip-flops configured to store the first data and a second group of retention-relevant flip-flops configured to store the second data. The memory block is configured to maintain memory data in the memory block during a retention operational mode. The retention control circuitry is coupled to the logic block and the memory block. The retention control circuitry is configured to cause the retention-relevant flip-flops of the second group to be activated into multiple scan chains. The retention control circuitry is also configured to migrate the second data between the second group of the retention-relevant flip-flops and the memory block using the multiple scan chains to accommodate transitions between the retention operational mode and a regular operational mode.

DETAILED DESCRIPTION

Figure 1:
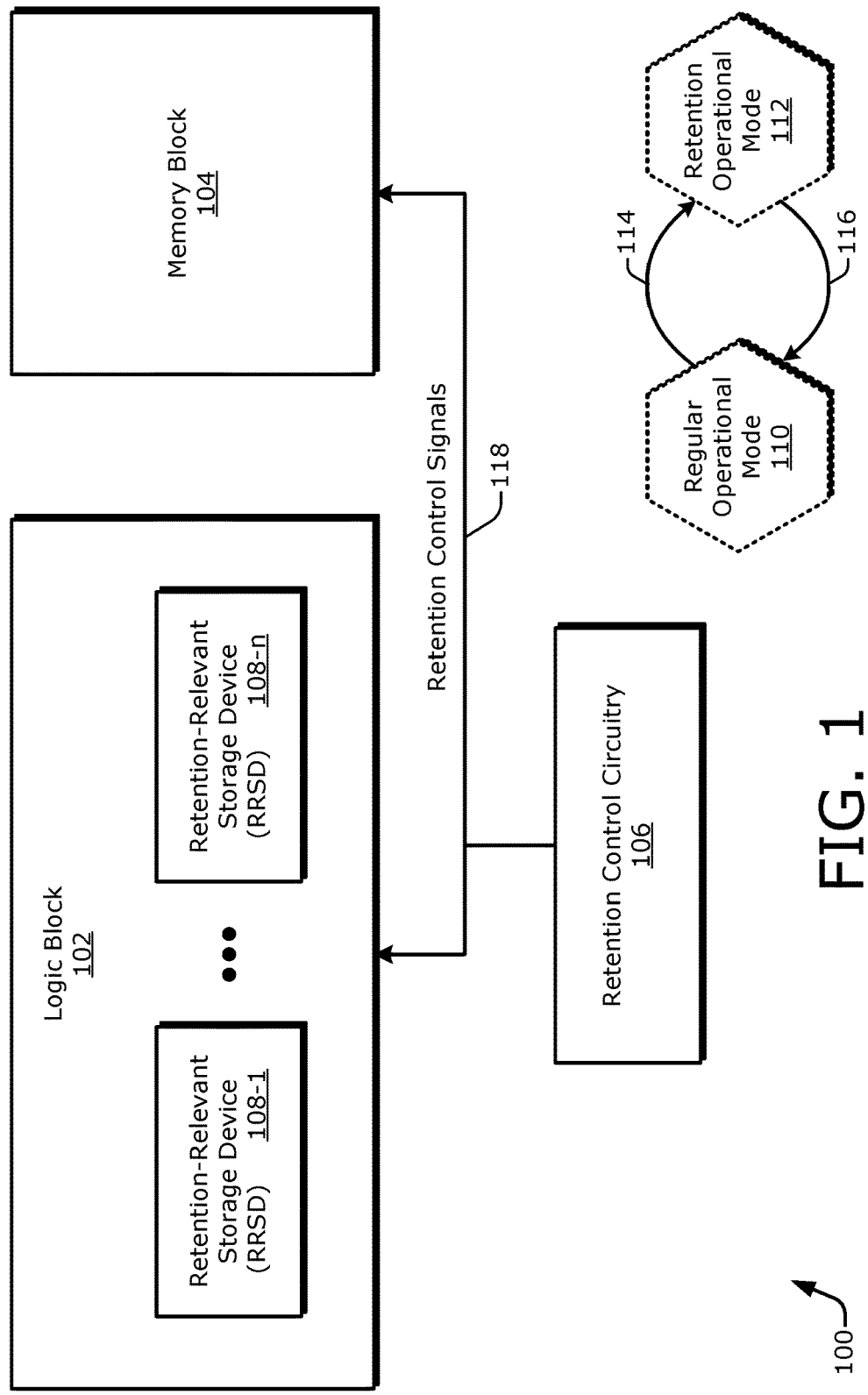
FIG. 1 illustrates an example portion of an integrated circuit having multiple blocks that can transition between a regular operational mode and a retention operational mode.

Power management of electronic devices entails controlling an amount of energy that an integrated circuit (IC) consumes over time or on an instantaneous basis. Energy consumption can be reduced to zero or near zero during times of non-use if an integrated circuit is powered down completely. At times of lower utilization or to retain some stored data, an integrated circuit may be powered down to a lower voltage level to reduce power consumption. Also, if an integrated circuit cannot be powered down as a whole, then one or more portions, or cores, may be powered down independently of one another. If some data is to be retained while a core is powered down, the integrated circuit transitions from a regular operational mode to a retention operational mode.

Powering down a core, however, risks the viability of functional data. Functional data includes data to be used for an ongoing computing task that is performed by logic circuitry to implement some functionality, such as video processing or input/output management. This viability risk arises because functional data will be lost if power is removed from certain types of computer memory. To avoid a loss of functional data when a core of an integrated circuit is being powered down, the functional data can be stored in one or more particular types of memory that maintain data during a power collapse period. In other words, some memory types, such as flash memory, are capable of maintaining stored data when power is removed from the memory. Flash memory, however, is unsuitable for high-speed processing because read/write access times are too slow.

Another type of memory that is capable of maintaining data during a power collapse period is called a retention flip-flop (RFF). Generally, flip-flops may be implemented as retention flip-flops or non-retention flip-flops. A flip flop (FF), or flop, is a unit of computing memory that stores a bit of functional data. Flip-flops are relatively fast memory units, so integrated circuit designers employ flip-flops frequently across different functional cores of a chip. A typical flip-flop includes a master portion and a slave portion in which data is migrated internally from the master portion to the slave portion. Clocked, or synchronous, flip-flops are configured to enable data migration such that the data stored in the master portion is transferred to the slave portion responsive to a pulse of a clock signal.

Non-retention flip-flops are volatile memory that relinquish stored data if powered down, such as because of a power collapse event that occurs with a core that includes the non-retention flip-flops. Retention flip-flops, on the other hand, are capable of retaining data during a power collapse period. In one approach, a retention flip-flop obtains power from a power rail that does not lose power during a power collapse event, so the retention flip-flop can therefore retain the one bit of functional data. Consequently, such retention flip-flops can support efforts to manage power consumption by facilitating the retention of functional data during a power collapse period without resorting to a slower memory type, such as flash memory.

Thus, retention flip-flops are fast and can be used to retain data during a power collapse event. However, retention flip-flops do have a downside. Retention flip-flops, not only occupy more area than flash memory on a per-bit basis, but retention flip-flops also occupy more area than non-retention flip-flops. In some implementations, a retention flip-flop can occupy from 40% to 2-3 times more area than that of a non-retention flip-flop. Because increased area on an integrated circuit chip translates to increased cost for the chip, utilizing retention flip-flops to retain data during power collapse periods becomes expensive. In other retention flip-flop implementations that may occupy slightly less area, the routing of control or power lines to the retention flip-flops is time consuming during a design phase of the integrated circuit, which adds to the cost of the chip as well as slows the time-to-market. With conventional systems, there is therefore a tradeoff between the faster, but more costly retention flip-flops and the slower, but cheaper forms of non-volatile memory.

In contrast with the tradeoffs accompanying the strict dichotomy of conventional approaches, example implementations that are described herein use both flip-flops and cheaper forms of memory for the same functional data of a logic block. Flip-flops of a logic block store functional data for a regular operational mode, but another memory that can maintain the data during a power collapse of the logic block stores the functional data for a retention operational mode. To facilitate a transition between the regular operational mode and the retention operational mode, the functional data is migrated from the flip-flops to the other memory. For a transition back to the regular operational mode, the functional data is migrated from the other memory back to the flip-flops. With this approach, the functional data can be retained without the additional area or routing issues that incur such a cost when using retention flip-flops.

This approach therefore saves area on an integrated circuit as well as reduces design time for the integrated circuit. However, the transition from the retention operational mode to the regular operational mode incurs a delay due to the time taken to migrate the data from the other memory back to the flip-flops. This delay can adversely impact user performance because the logic block takes longer to be ready to resume processing after the power collapse. To ameliorate this delay, the flip-flops of the logic block can be separated into two groups in some implementations. The flip-flops are grouped according to a latency sensitivity of the corresponding functionality that is supported by a given flip-flop. In other words, if a functionality supported by a first flip-flop impacts the latency of a logic block being re-initialized after a power collapse more than a second flip-flop, the first flip-flop has a higher latency sensitivity. Examples of functionalities with relatively higher latency sensitivities include those involved with boot functionality and those involved with phase-locked loop (PLL) functionality.

Flip-flops of a logic block are therefore grouped based on latency sensitivity. Those flip-flops with a relatively higher latency sensitivity are placed in a first group. These flip-flops of the first group with a higher latency sensitivity are deployed as retention flip-flops in which functional data is retained with a local retention mechanism during retention operational modes. Flip-flops with a lower latency sensitivity are placed in a second group. The functional data stored by flip-flops of the second group are retained using a remote retention mechanism. For example, the functional data of the second group are migrated between the logic block and a memory block to accommodate transitions between the regulation operational mode and the retention operational mode. Thus, flip-flops that may impact a logic block's ability to return to processing after a power collapse event are retained locally at the logic block. Those flip-flops that are less likely to impact a logic block's speed of reinitializing are retained remotely using a slower, but cheaper, memory type.

More generally, in example implementations, retention-relevant storage devices store functional data for a logic block. As used herein, a "retention-relevant storage device" stores functional data in a logic block for a processing task during a regular operational mode and is configured such that the functional data of an in-progress processing task is also retained during a retention operational mode. With the functional data surviving a power collapse event, the in-progress processing task can be reinitiated upon the conclusion of the retention operational mode. For a retention-relevant storage device, the functional data can be retained using a local retention mechanism or a remote retention mechanism.

With a local retention mechanism, a retention-relevant storage device is implemented as a retention storage device that retains data at the retention-relevant storage device (e.g., a retention flip-flop). With a remote retention mechanism, on the other hand, a retention-relevant storage device is implemented as storage device in which the corresponding stored data is migrated to another memory so the data can nevertheless be retained (e.g., a flip-flop without an intrinsic retention capability). The other memory may include a non-volatile memory; a memory disposed in a different, non-collapsing power domain; and so forth. Examples of retention-relevant storage devices include retention flip-flops, flip-flops without an intrinsic retention feature that are nevertheless configured to store data that is retained via a data migration scheme, and so forth.

In example implementations, an integrated circuit includes a logic block, a memory block, and retention control circuitry. The integrated circuit, or at least a portion thereof, is configured to implement a regular operational mode and a retention operational mode. The logic block includes multiple retention-relevant storage devices that are configured to store first data and second data. The multiple retention-relevant storage devices include a first group of retention-relevant storage devices implemented as retention storage devices that are configured to store the first data and to retain the first data during the retention operational mode. The memory block is configured to maintain memory data in the memory block during the retention operational mode. The multiple retention-relevant storage devices include a second group of retention-relevant storage devices configured to store the second data during the regular operational mode. The retention control circuitry is coupled to the logic block and the memory block. The retention control circuitry is configured to migrate the second data from the second group of the retention-relevant storage devices to the memory block to prepare for the retention operational mode. The retention control circuitry is also configured to migrate the second data from the memory block to the second group of the retention-relevant storage devices of the logic block to prepare for the regular operational mode. In these manners, the retention control circuitry can accommodate transitions between the retention operational mode and the regular operational mode.

Thus, retention-relevant storage devices that support a functionality with a relatively higher latency sensitivity with regard to waking up a core can be deployed as part of the first group. Retention-relevant storage devices that support a functionality with a relatively lower latency sensitivity with regard to waking up the core can be deployed as part of the second group. With these approaches, retention-relevant storage devices having intrinsic retention capabilities that are relatively faster, but are more costly, are reserved for those functionalities that facilitate awakening a core. Retention-relevant storage devices that rely on extrinsic, migration-based retention capabilities are used for other functionalities that will be impacted less by latencies arising from transferring data back into the core from another memory.

FIG. 1 illustrates an example portion 100 of an integrated circuit having multiple blocks that can transition between a regular operational mode 110 and a retention operational mode 112. As shown, the portion 100 includes a logic block 102, a memory block 104, and retention control circuitry 106. The retention control circuitry 106 is coupled to the logic block 102 and the memory block 104. The logic block 102 includes multiple retention-relevant storage devices 108-1 to 108-*n* (RRSD), with "n" representing an integer.

In an example operation, the retention control circuitry 106 provides one or more retention control signals 118 to the logic block 102 or the memory block 104. The retention control signals 118 are used to manage transitions between the regular operational mode 110 and the retention operational mode 112. More specifically, the retention control circuitry 106 provides the retention control signals 118 to manage a power-down transition 114 from the regular operational mode 110 to the retention operational mode 112. The retention control circuitry 106 also provides the retention control signals 118 to manage a power-up transition 116 from the retention operational mode 112 to the regular operational mode 110.

In example implementations, the logic block 102 performs some logical functionality. Example functionalities include general processing, such as that provided by a processing core or a group of processing cores; signal processing; modem functionality; video processing; security functionality; bus control; graphics; or a radio or communications interface. The memory block 104 stores information for the logic block 102, another logic block (not shown), or provides bulk memory storage for an integrated circuit. Examples of the memory block 104 include random-access memory (RAM), such as dynamic RAM (DRAM) or static RAM (SRAM); flash memory; electrically erasable programmable read-only memory (EEPROM); cache memory; synchronous memory; shared memory; graphics memory; or some combination thereof.

Each retention-relevant storage device 108 stores data (e.g., one or more bits) that enables the logic block 102 to perform some functionality, including functional data during active processing times. The modifier "retention-relevant" for the multiple retention-relevant storage devices 108-1 to 108-*n* indicates that the data stored in each retention-relevant storage device 108 is to survive the retention operational mode 112, including a power collapse event thereof using at least one of a local retention mechanism or a remote retention mechanism. A power collapse event is described with reference to FIG. 2.

Figure 2:
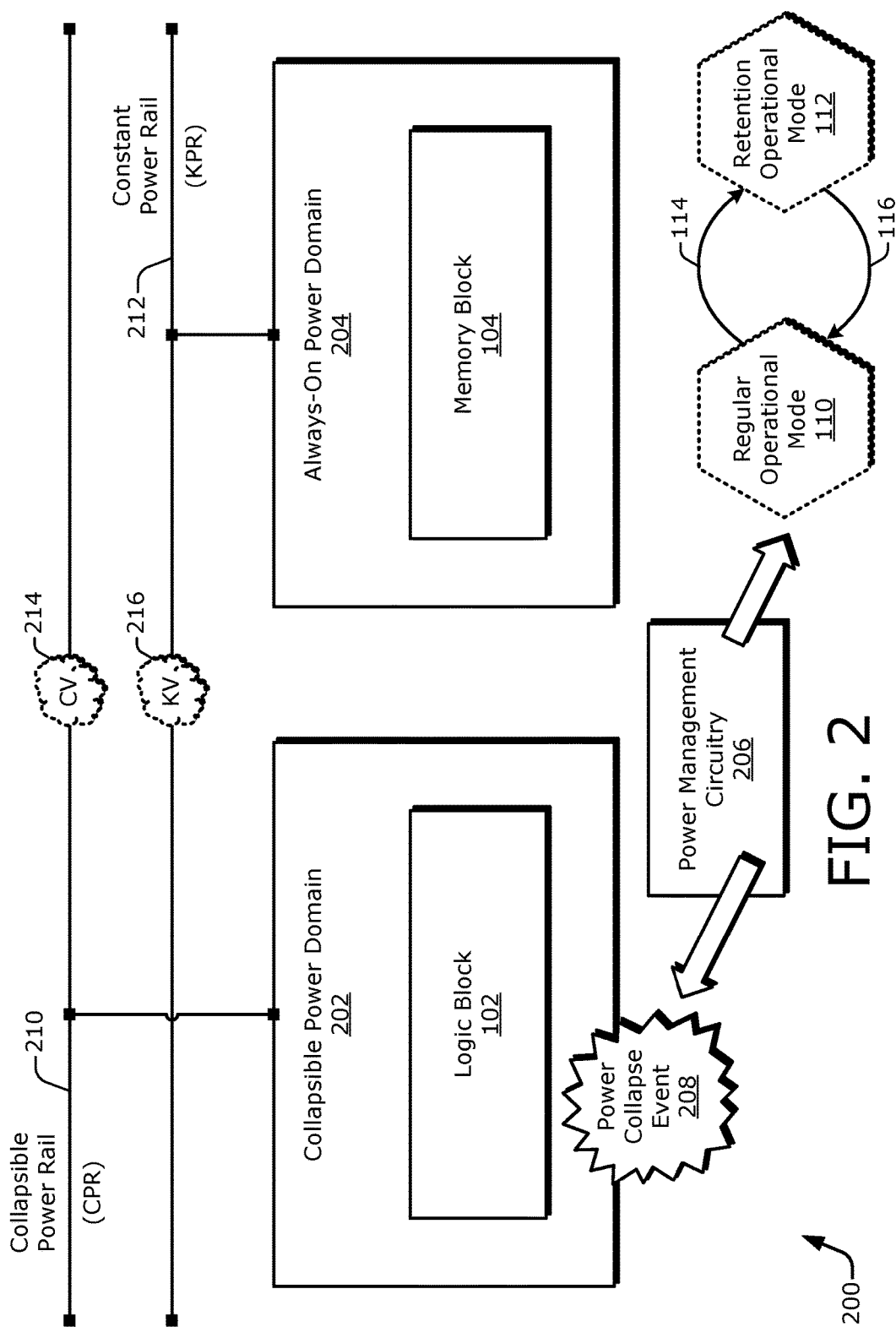
FIG. 2 illustrates examples of different power domains for a logic block and a memory block of an integrated circuit that may be powered differently during the regular operational mode or the retention operational mode.

FIG. 2 illustrates generally at 200 examples of different power domains for the logic block 102 and the memory block 104 of an integrated circuit that may be powered differently during the regular operational mode 110 or the retention operational mode 112. An example of a power management scheme for an integrated circuit is depicted. FIG. 2 illustrates a collapsible power domain 202, an always-on power domain 204, power management circuitry 206, a collapsible power rail 210 (CPR), and a constant power rail 212 (KPR). The collapsible power domain 202 is coupled to the collapsible power rail 210, and the always-on power domain 204 is coupled to the constant power rail 212. A power management integrated circuit (PMIC) (not shown) holds the collapsible power rail 210 at a collapsible voltage 214 (CV) and the constant power rail 212 at a constant voltage 216 (KV).

As shown, the collapsible power domain 202 includes the logic block 102, and the always-on power domain 204 includes the memory block 104. Although two different power domains are shown, more than two may alternatively be implemented. Also, although each power domain is depicted in FIG. 2 and described herein as including one block, a given power domain may include multiple blocks. In example implementations, the power management circuitry 206 performs power management operations to reduce the power consumed by the integrated circuit. For example, the power management circuitry 206 can cause the collapsible power domain 202 to experience a power collapse event 208 using the collapsible power rail 210 for a retention operational mode 112.

At times of relatively higher utilization, the integrated circuit operates in the regular operational mode 110. At times of relatively lower utilization, the power management circuitry 206 can lower the power consumption of the integrated circuit by powering down the collapsible power domain 202. To do so, the power management circuitry 206 removes power from the collapsible power rail 210. The power management circuitry 206 can cause the collapsible voltage 214 to drop to a ground potential by using a switch to disconnect the collapsible power rail 210 from a supply power rail, by requesting that the PMIC lower—including turn off—a voltage supplied to the collapsible power rail 210, and so forth. The collapsible power domain 202 is therefore unpowered during at least a portion of the retention operational mode 112.

Thus, the power management circuitry 206 can reduce power consumption of the integrated circuit by powering down the collapsible power domain 202, which causes a power collapse event 208 for the logic block 102. However, the logic block 102 includes functional data that can be usefully employed in continuing processing tasks if the functional data survives the power collapse event 208. Accordingly, the power management circuitry 206 initiates a power-down transition 114 to reach the retention operational mode 112. During the retention operational mode 112, at least some of the functional data stored in the logic block 102 survives the power collapse event 208.

With an example local retention mechanism, the functional data is retained within the logic block 102. With an example remote retention mechanism, the functional data is retained by migrating the functional data to the memory block 104. As shown in FIG. 2, the memory block 104 is disposed in the always-on power domain 204 that is coupled to the constant power rail 212. Consequently, the contents of the memory block 104 is maintained during the retention operational mode 112. In alternative implementations, the memory block 104 can be realized with non-volatile memory in which memory contents are maintained without being supplied with power (e.g., the memory block 104 can be implemented as flash memory). With a non-volatile memory implementation of the memory block 104, the logic block 102 and the memory block 104 may be disposed within a single power domain.

As used herein, the term "always-on" for the always-on power domain 204 is relative to the power of the collapsible power domain 202. In other words, "always-on" implies that the power for the memory block 104 continues during the retention operational mode 112 while the logic block 102 experiences the power collapse event 208. At other times, an entire integrated circuit chip or an area of a chip that includes both of the illustrated power domains can be powered down.

Figure 3:
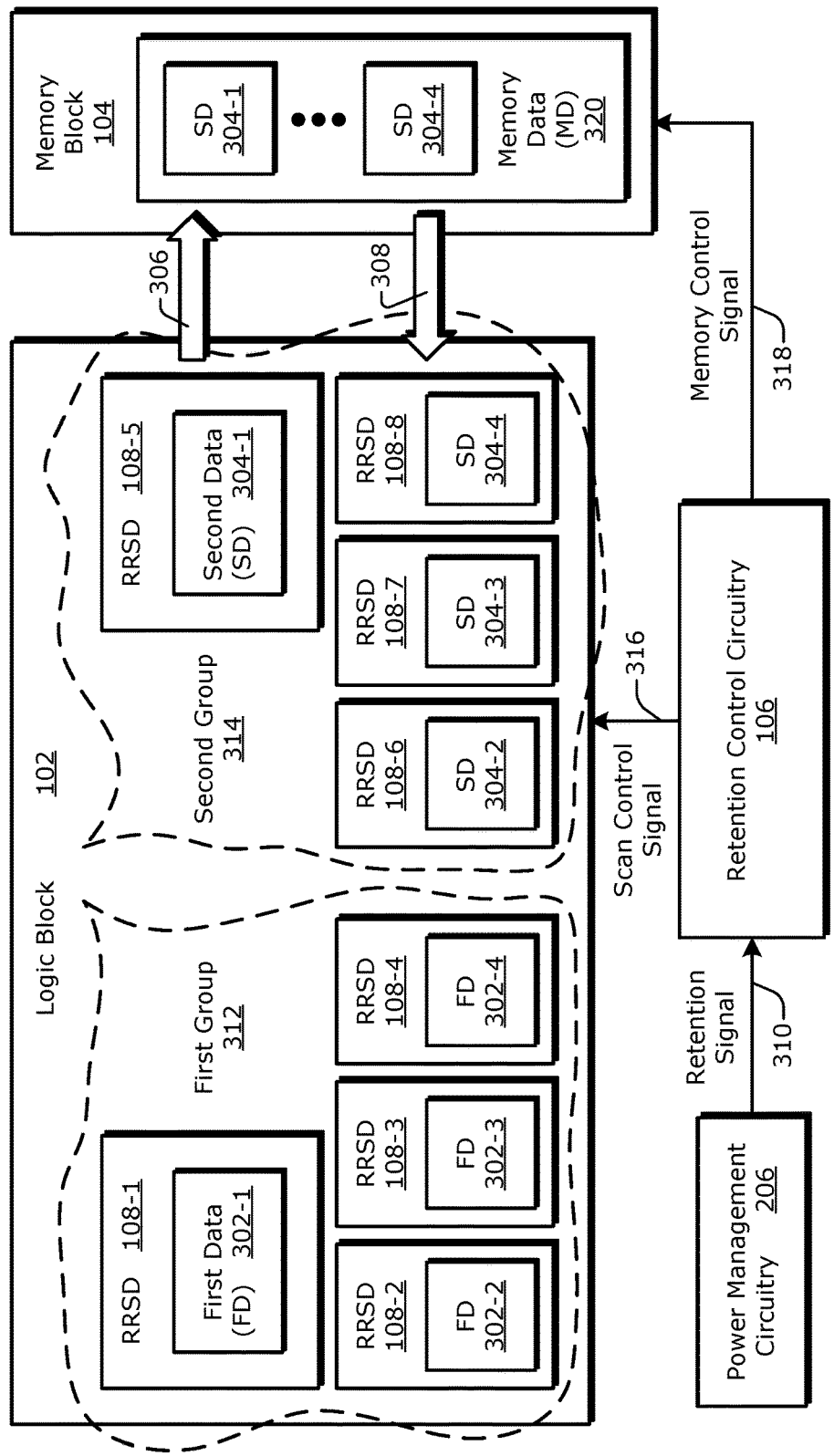
FIG. 3 illustrates an example of the logic block including a first group and a second group of multiple retention-relevant storage devices.

FIG. 3 illustrates generally at 300 an example of the logic block 102 including a first group 312 and a second group 314 of multiple retention-relevant storage devices 108-1 to 108-*n*. Eight retention-relevant storage devices 108-1 to 108-8 are explicitly depicted. The first group 312 includes retention-relevant storage devices 108-1, 108-2, 108-3, and 108-4. The second group 314 includes retention-relevant storage devices 108-5, 108-6, 108-7, and 108-8. Although eight total retention-relevant storage devices and four per group are shown, the numbers of retention-relevant storage devices overall or per group may differ from the eight and four shown, respectively. The memory block 104 is shown with memory data 320 (MD). The memory block 104 maintains the contents of the memory data 320 during a retention operational mode 112 as described above with reference to FIG. 2.

The power management circuitry 206 provides a retention signal 310 to the retention control circuitry 106. The retention signal 310 indicates that the regular operational mode 110 is ending and the retention operational mode 112 is starting, and vice versa. If the retention signal 310 is being asserted by the power management circuitry 206, the retention operational mode 112 is in effect or the power-down transition 114 is to occur. If, on the other hand, the retention signal 310 is being de-asserted by the power management circuitry 206, the regular operational mode 110 is in effect or the power-up transition 116 is to occur. To facilitate a retention mechanism that is described herein, the retention control circuitry 106 generates at least one scan control signal 316 and at least one memory control signal 318. The retention control circuitry 106 provides the scan control signal 316 to the multiple retention-relevant storage devices 108-1 to 108-n of the logic block 102 and the memory control signal 318 to the memory block 104.

The first group 312 stores first data 302 (FD), and the second group 314 stores second data 304 (SD). For the first group 312, the retention-relevant storage device 108-1, 108-2, 108-3, and 108-4 respectively stores first data 302-1, 302-2, 302-3, and 302-4. For the second group 314, the retention-relevant storage device 108-5, 108-6, 108-7, and 108-8 stores second data 304-1, 304-2, 304-3, and 304-4, respectively. Each item of first data or second data may include one or more bits.

In example implementations, the retention-relevant storage devices of the first group 312 are retained using a different mechanism than the retention-relevant storage devices of the second group 314. The first data 302 of the first group 312 is retained using a local retention mechanism. For example, the first data 302-1, 302-2, 302-3, and 302-4 is respectively retained at the corresponding retention-relevant storage device 108-1, 108-2, 108-3, and 108-4. The second data 304 of the second group 314 is retained using a remote retention mechanism. For example, the second data 304 can be transferred to a different block or power domain if the logic block 102 is to experience a power collapse event 208 (of FIG. 2).

The retention control circuitry 106 causes the second data 304 of the second group 314 to be migrated from the retention-relevant storage devices 108-5, 108-6, 108-7, and 108-8 to the memory block 104. A data egress migration 306 is performed as part of the power-down transition 114 from the regular operational mode 110 to the retention operational mode 112. The retention control circuitry 106 uses the scan control signal 316 and the memory control signal 318 to transfer the second data 304-1 to 304-4 out of the logic block 102 to become the memory data 320. At the conclusion of the retention operational mode 112, a data ingress migration 308 is performed as part of the power-up transition 116 from the retention operational mode 112 to the regular operational mode 110. The retention control circuitry 106 uses the scan control signal 316 and the memory control signal 318 to transfer the second data 304-1 to 304-4, which has been maintained as the memory data 320, from the memory block 104 back to the logic block 102. Specifically, the retention control circuitry 106 transfers the second data 304-1, 304-2, 304-3, and 304-4 back to the second group 314, including to the retention-relevant storage devices 108-5, 108-6, 108-7, and 108-8, respectively.

Generally, different groups of retention-relevant storage devices are associated with different retention mechanisms, such as a first retention mechanism, a second retention mechanism, and so forth. Here, the local retention mechanism applied to the first data 302 of the first group 312 involves relatively more circuitry but provides a shorter latency period for the logic block 102 to regain the ability to process tasks in the regular operational mode 110 after leaving the retention operational mode 112. In contrast, the remote retention mechanism applied to the second data 304 of the second group 314 involves relatively less circuitry but institutes a longer latency period for the logic block 102 to regain the ability to process tasks upon returning to the regular operational mode 110.

Accordingly, a given retention-relevant storage device 108 can be assigned to a group based on an extent to which a shorter or longer latency period may impact an ability of a logic block to reinitiate a processing task after being powered up. This in turn means that the functionality implemented by a retention-relevant storage device 108 can be used to assign the retention-relevant storage device 108 to a particular group. For example, if a retention-relevant storage device 108 implements for the logic block 102 a first functionality having a relatively higher latency sensitivity with respect to transitioning from the retention operational mode 112 to the regular operational mode 110, the retention-relevant storage device 108 can be assigned to the first group 312 with the local retention mechanism. On the other hand, if a retention-relevant storage device 108 implements for the logic block 102 a second functionality having a relatively lower latency sensitivity with respect to transitioning from the retention operational mode 112 to the regular operational mode 110, the retention-relevant storage device 108 can be assigned to the second group 314 with the remote retention mechanism.

Examples of functionality, which have a relatively higher latency sensitivity with respect to the power-up transition 116, include a boot functionality for the logic block 102, a phase-locked loop (PLL) functionality for the logic block 102, or combinations thereof. Multiple alternatives may be implemented instead of the specific examples shown in FIG. 3 or described above. For example, the retention-relevant storage devices 108 can be divided into three or more groups, such as if there are three different latency sensitivities and three corresponding retention mechanisms. Also, the data of both groups (or a single group) in the logic block 102 can be retained using a remote retention mechanism as described herein for the second group 314. Further, although the retention-relevant storage devices are physically separated into two groups as depicted in FIG. 3 for clarity, the locations of retention-relevant storage devices of different groups may be physically intermingled across different areas of the logic block 102.

Figure 4:
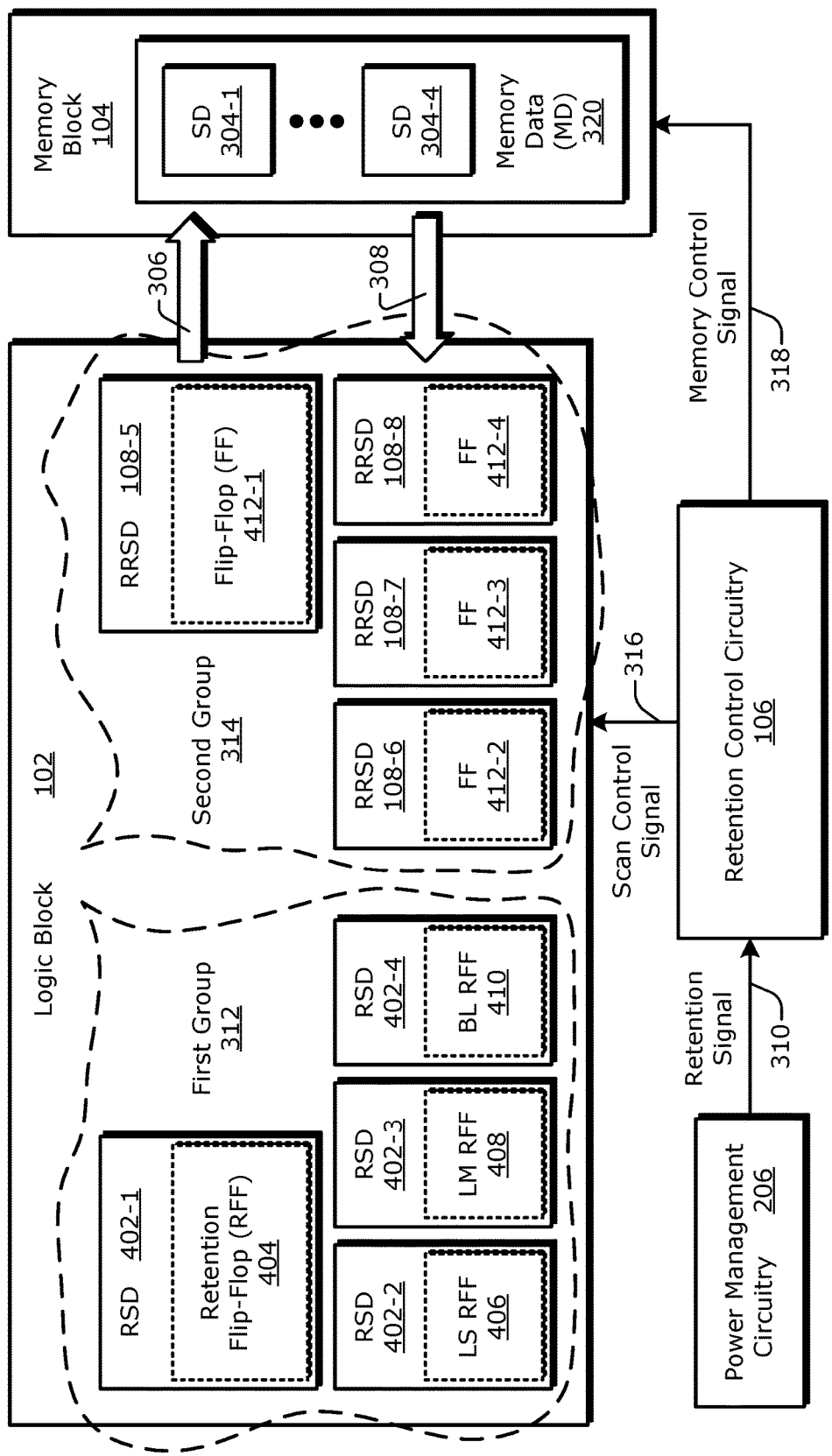
FIG. 4 illustrates examples of different implementations of the multiple retention-relevant storage devices.

FIG. 4 illustrates generally at 400 examples of different implementations of the multiple retention-relevant storage devices 108-1 to 108-n (of FIG. 1). In FIG. 4, each of the retention-relevant storage devices 108-1 to 108-4 (as shown in FIG. 3) of the first group 312 is implemented as a respective retention storage device 402 (RSD). Four retention storage devices 402-1, 402-2, 402-3, and 402-4 are shown as being part of the first group 312. The retention storage devices 402-1 to 402-4 are configured to retain respective first data at each respective retention storage device 402 as part of a local retention mechanism. The second group 314 continues to include the retention-relevant storage devices 108-5 to 108-8. Each retention-relevant storage device is implemented as at least one retention-relevant flip-flop in the examples depicted in FIG. 4. A retention-relevant flip-flop stores at least one bit of data.

As shown, the retention storage devices 402-1, 402-2, 402-3, and 402-4 are implemented as some type of retention flip-flop 404 (RFF). The retention storage device 402-1 is implemented as a general retention flip-flop 404. A retention flip-flop 404 generally stores first data and retains the first data during a retention operational mode 112 using a local retention mechanism. The retention storage device 402-2 is implemented as a live-slave retention flip-flop 406 (LS RFF). The retention storage device 402-3 is implemented as a live-master retention flip-flop 408 (LM RFF). The retention storage device 402-4 is implemented as a balloon-latch retention flip-flop 410 (BL RFF). These three example types of retention flip-flops are described in the following paragraphs in terms of how each stores and retains first data.

The live-slave retention flip-flop 406 retains data in a slave portion of a retention flip-flop during a retention operational mode 112. The slave portion of a live-slave retention flip-flop 406 is isolated from other circuitry and remains powered during the retention operational mode 112 such that the data in the slave portion survives a power collapse period. With reference to FIG. 2, the slave portion can be coupled to the constant power rail 212, and the master portion can be coupled to the collapsible power rail 210.

The live-master retention flip-flop 408 retains data in a master portion of a retention flip-flop during a retention operational mode 112. The master portion of a live-master retention flip-flop 408 is isolated from other circuitry and remains powered during the retention operational mode 112 such that the data in the master portion survives a power collapse period. With reference to FIG. 2, the master portion can be coupled to the constant power rail 212, and the slave portion can be coupled to the collapsible power rail 210.

The balloon-latch retention flip-flop 410 retains data in a latch that is separate from both the slave portion and the master portion of the retention flip-flop. This separate, additional latch remains powered during the retention operational mode 112 while the slave and master portions of the balloon-latch retention flip-flop 410 are permitted to drift toward ground during a power collapse event. As part of the power-down transition 114, the stored data is moved to the separate latch of the balloon-latch retention flip-flop 410 to safely sequester the data during the power collapse event. Upon conclusion of the retention operational mode 112, as part of the power-up transition 116, the sequestered data is transferred back to the slave or master portion of the balloon-latch retention flip-flop 410.

Thus, the retention storage devices 402-1, 402-2, 402-3, and 402-4 of the first group 312 implement a local retention mechanism. In contrast, the retention-relevant storage devices 108-5, 108-6, 108-7, and 108-8 of the second group 314 implement a remote retention mechanism. Each of the retention-relevant storage devices 108-5, 108-6, 108-7, and 108-8 is implemented with at least one flip-flop. Specifically, the retention-relevant storage devices 108-5, 108-6, 108-7, and 108-8 are respectively implemented with flip-flops 412-1, 412-2, 412-3, and 412-4. Each of the flip-flops 412-1, 412-2, 412-3, and 412-4 stores one bit of data during the regular operational mode 110. However, the flip-flops 412-1, 412-2, 412-3, and 412-4 are not designed to retain any second data locally during the retention operational mode 112.

To retain the second data 304 (as shown in FIG. 3) of the second group 314 during the retention operational mode 112, the second data is migrated to the memory block 104. The retention control circuitry 106 controls the logic block 102 with the scan control signal 316 and the memory block 104 with the memory control signal 318. The retention control circuitry 106 causes the second data 304-1, 304-2, 304-3, and 304-4 to be migrated from respective ones of the multiple flip-flops 412-1, 412-2, 412-3, and 412-4 to the memory block 104 (e.g., as represented by the data egress migration 306) to be maintained as the memory data 320. The second data 304 therefore survives the retention operational mode 112. To prepare for the regular operational mode 110, the retention control circuitry 106 causes the second data 304-1, 304-2, 304-3, and 304-4 to be migrated from the memory block 104 back to respective ones of the multiple flip-flops 412-1, 412-2, 412-3, and 412-4 (e.g., as represented by the data ingress migration 308). These data migrations are facilitated by activating the multiple flip-flops 412-1, 412-2, 412-3, and 412-4 into one or more scan chains, which are described with reference to FIG. 5.

Figure 5:
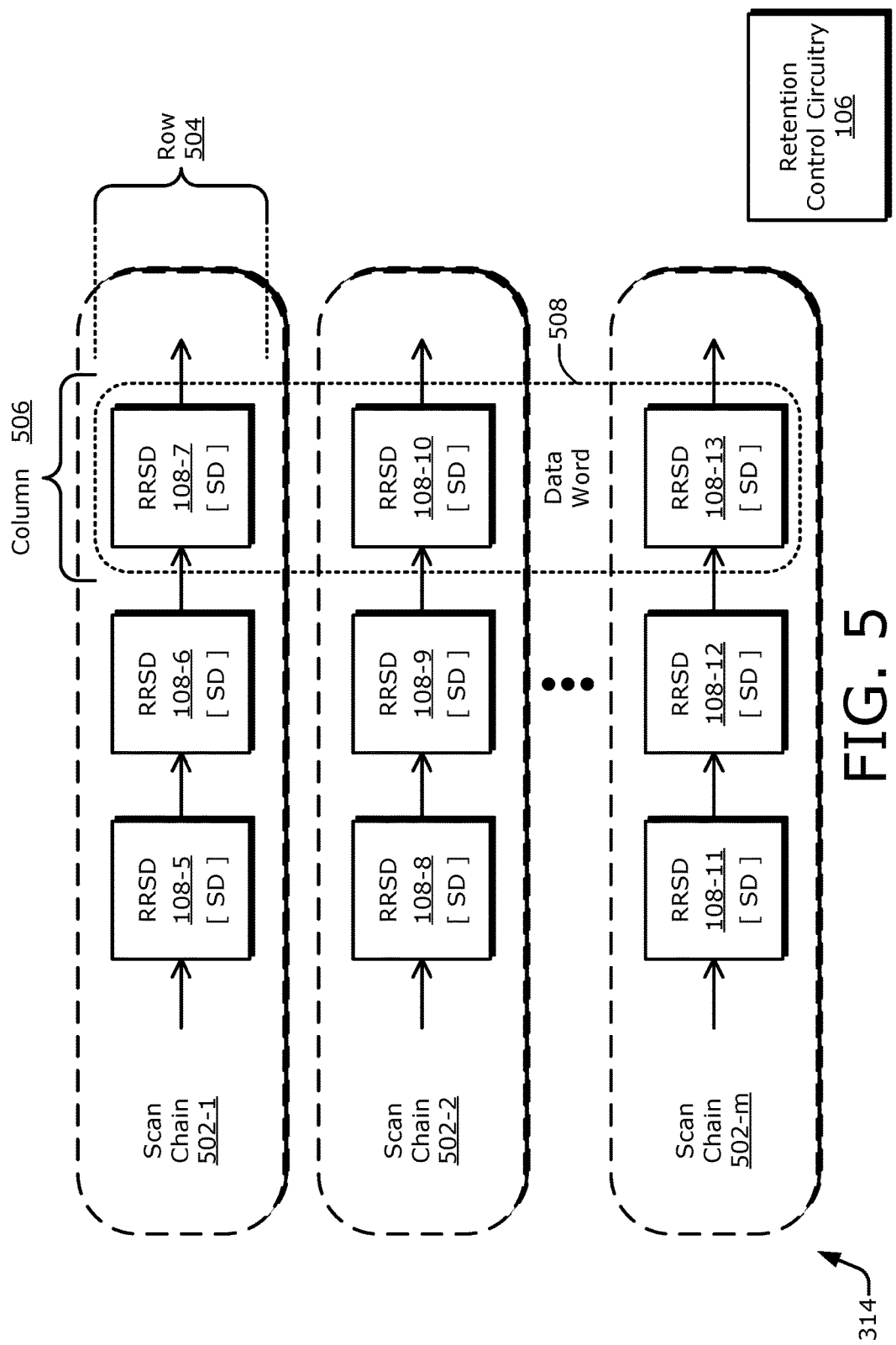
FIG. 5 illustrates examples of multiple scan chains that are formed from the multiple retention-relevant storage devices of the logical block.

FIG. 5 illustrates examples of multiple scan chains that are formed from the multiple retention-relevant storage devices of the logical block 102. Here, the retention control circuitry 106 activates the retention-relevant storage devices of the second group 314 into multiple scan chains 502-1, 502-2 . . . 502-*m*, with "m" representing an integer. As shown, the scan chain 502-1 includes retention-relevant storage devices 108-5, 108-6, and 108-7 that each store second data, as indicated by the "[SD].". The scan chain 502-2 includes retention-relevant storage devices 108-8, 108-9, and 108-10 that each store second data. The scan chain 502-*m* includes retention-relevant storage devices 108-11, 108-12, and 108-13 that each store second data.

In example implementations, the retention control circuitry 106 organizes the retention-relevant storage devices into a logical grid or array having multiple rows and columns. Each row 504 respectively corresponds to a scan chain 502 of the multiple scan chains 502-1 to 502-*m*. Each column 506 respectively corresponds to a data word 508 that is to be stored in the memory block 104. The logical grid arises from a combination of the activated scan chains forming the rows and the manner in which the data word 508 is extracted from a final column 506 to migrate the data word 508 to the memory block 104. Although each scan chain 502 is shown in FIG. 5 as including three retention-relevant storage devices, a scan chain 502 can include fewer or more (e.g., tens, hundreds, or thousands) of such devices. Also, although each illustrated scan chain 502 has an equal number of retention-relevant storage devices in FIG. 5, scan chains may alternatively have different lengths. For scan chains that are shorter than a longest scan chain 502, the retention control circuitry 106 can add data padding for the data word 508 as described below with reference to FIGS. 7 and 8.

In operation, the retention control circuitry 106 activates the multiple retention-relevant storage devices into multiple scan chains 502-1 to 502-*m* to realize the multiple rows 504. The retention control circuitry 106 advances the data in each retention-relevant storage device sequentially along a scan chain 502 from one retention-relevant storage device to a consecutive retention-relevant storage device. Thus, second data of the second group 314 is advanced from one column 506 to another column 506. For example, in the scan chain 502-1, second data is advanced from the retention-relevant storage device 108-5 to the retention-relevant storage device 108-6 and from the retention-relevant storage device 108-6 to the retention-relevant storage device 108-7.

The retention control circuitry 106 advances the second data between consecutive retention-relevant storage devices by shifting the second data along the scan chain 502. An example implementation of a scan chain 502 that enables such shifting is described below with reference to FIG. 6. At the end of each scan chain 502, the second data is shifted out of the last column 506 as the data word 508. Second data from each retention-relevant storage device 108 in the column 506 are combined to form the data word 508. For example, the second data from the retention-relevant storage devices 108-7, 108-10 . . . 108-13 can be concatenated to form the data word 508. The data word 508 is then transferred to the memory block 104, which process is described further with reference to FIG. 7.

Figure 6:
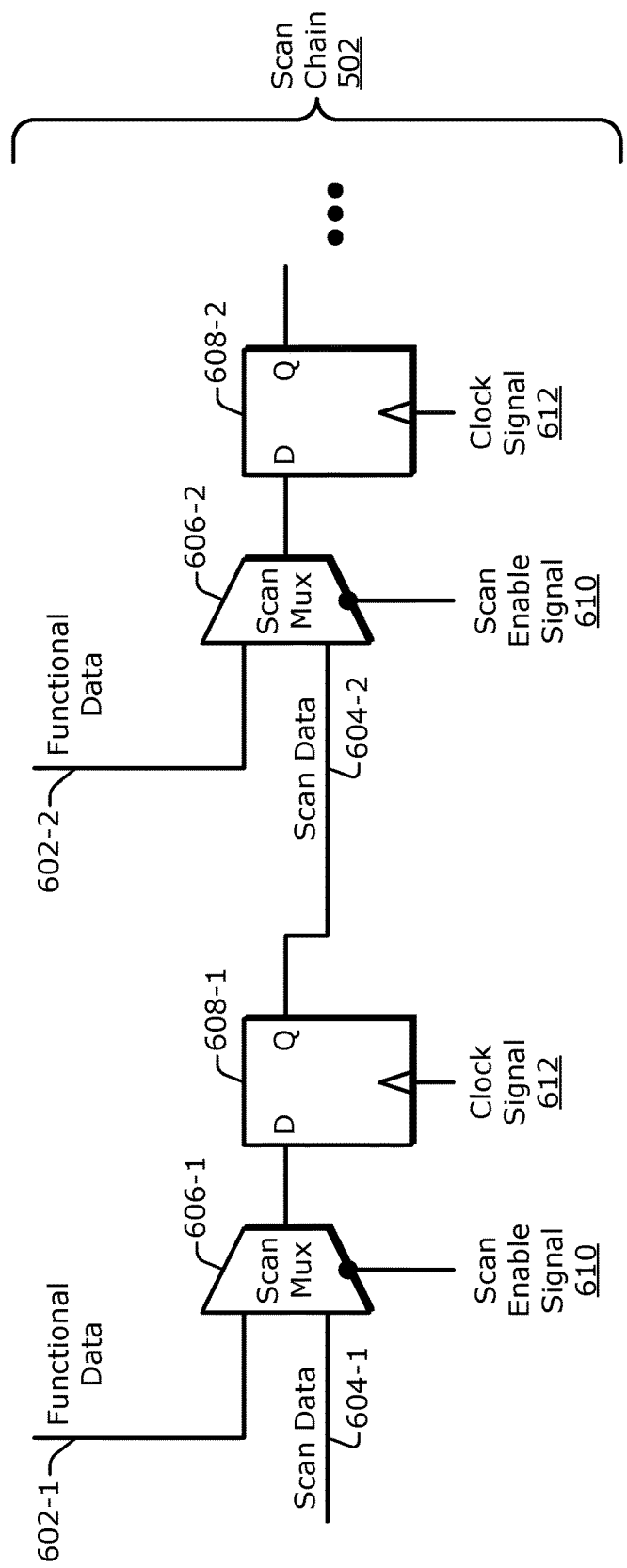
FIG. 6 illustrates an example scan chain portion formed from multiple retention-relevant flip-flops.

FIG. 6 illustrates an example scan chain portion 600 formed from multiple retention-relevant flip-flops. As shown, the scan chain portion 600 is formed from d-q flip-flops 608-1, 608-2 . . . that are clocked by a clock signal 612. However, retention-relevant flip-flops can be implemented with other types of flip-flops. A scan multiplexer 606-1, 606-2 . . . is respectively associated with each d-q flip-flop 608-1, 608-2 . . . along the scan chain 502. Each scan multiplexer 606 is controlled by a scan enable signal 610. Each scan multiplexer 606 includes a first input, a second input, and an output. Each respective scan multiplexer 606-1, 606-2 . . . receives respective functional data 602-1, 602-2 . . . at the first input and respective scan data 604-1, 604-2 . . . at the second input. The output of each scan multiplexer 606 is coupled to the "d" input of the associated d-q flip-flop 608.

An example operation is described with reference to the scan multiplexer 606-1 and the d-q flip-flop 608-1. The scan multiplexer 606-1 receives functional data 602-1 at the first input. The functional data 602-1 includes information (e.g., one data bit) to be stored by the associated d-q flip-flop 608-1 for the logic block 102 as the logic block 102 performs some functionality. The scan multiplexer 606-1 receives scan data 604-1 at the second input. If the scan enable signal 610 is not asserted, the scan multiplexer 606-1 passes the functional data 602-1 at the output thereof to the "d" input of the associated d-q flip-flop 608-1. If the scan enable signal 610 is asserted, the scan multiplexer 606-1 passes the scan data 604-1 to the output thereof and to the "d" input of the d-q flip-flop 608-1.

The d-q flip-flop 608-1 forwards data at the "d" input to the "q" output of the d-q flip-flop 608-1 responsive to a rising or falling edge of the clock signal 612. The data provided at the "q" output of the d-q flip-flop 608-1 is coupled to the second input of the scan multiplexer 606-2 as the scan data 604-2. Thus, scan data 604 can be shifted sequentially along the scan chain 502 from one d-q flip-flop 608 to a consecutive d-q flip-flop 608 responsive to pulses of the clock signal 612. The scan data 604 is advanced along the scan chain 502 based on the scan enable signal 610 being asserted and the clock signal 612 oscillating or having pulses with rising and falling edges.

The at least one scan control signal 316 (e.g., of FIGS. 3, 7, and 8) can be implemented with the scan enable signal 610 or the clock signal 612. Accordingly, the retention control circuitry 106 can shift the second data 304 of the retention-relevant storage devices of the second group 314 as the scan data 604 along a scan chain 502. At the end of each scan chain 502, the scan data 604 is shifted out at the most-rightward, final column 506 (as shown in FIG. 5) to enable the second data 304 to be accessed serially. The second data 304 can therefore be migrated from the logic block 102 to the memory block 104, and vice versa, which is described below with reference to FIGS. 7 and 8.

Figure 7:
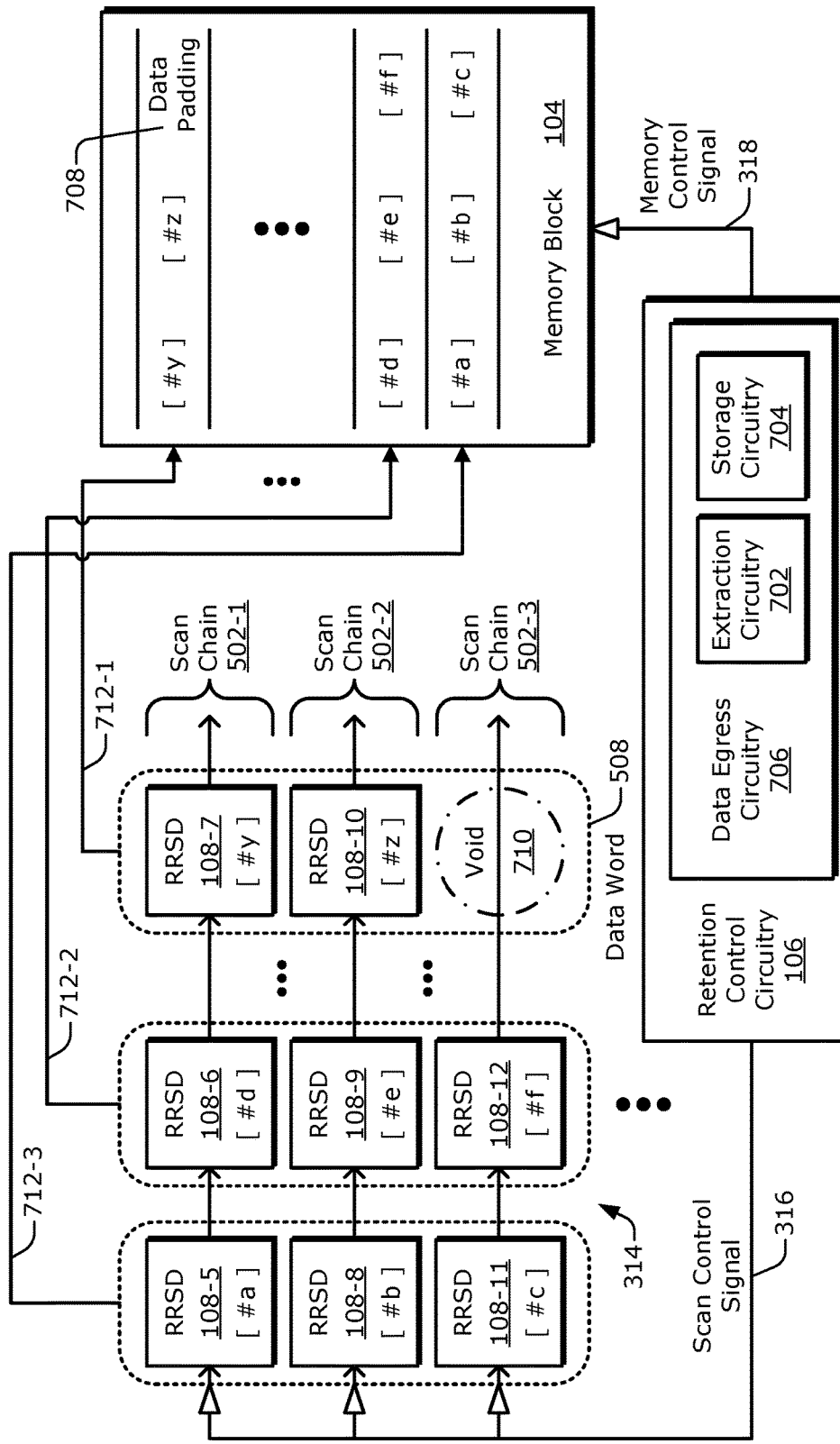
FIG. 7 illustrates an example data egress migration for a power-down phase in which retention control circuitry manages a transition from the regular operational mode to the retention operational mode with data migration.

FIG. 7 illustrates an example data egress migration 306 for a power-down phase (e.g., a power-down transition 114) in which retention control circuitry 106 manages a transition from the regular operational mode 110 to the retention operational mode 112 by migrating data. The retention control circuitry 106 includes data egress circuitry 706, which includes extraction circuitry 702 and storage circuitry 704. As shown, the second group 314 includes at least eight (8) retention-relevant storage devices that are part of the logic block 102 (e.g., of FIG. 3). The memory block 104 is capable of storing the second data of the second group 314 during the retention operational mode 112.

Specifically, the second group 314 includes retention-relevant storage devices 108-5, 108-6, 108-7, 108-8, 108-9, 108-10, 108-11, and 108-12. Each retention-relevant storage device 108 stores second data 304 (of FIG. 3). To explain an example migration operation, each second data is represented by a letter, such as "[#a]". Thus, the retention-relevant storage devices 108-5, 108-6, 108-7, 108-8, 108-9, 108-10, 108-11, and 108-12 respectively store #a, #d, #b, #e, #z, #c, and #f.

In operation generally, the retention control circuitry 106 places the logic block 102 of the collapsible power domain 202 into in a hybrid mode. This hybrid mode falls between a full functional mode and a full design for test (DFT) mode and is analogous to a design for diagnosability (DFD) mode. The data egress circuitry 706 migrates the second data of the second group 314 out of the logic block 102 and into the memory block 104 using a sequence of operations for the power-down transition 114. The extraction circuitry 702 activates the multiple retention-relevant storage devices 108-5 to 108-12 into at least three scan chains 502-1, 502-2, and 502-3.

In the illustrated example, the scan chains 502-1 and 502-2 have the same lengths. The scan chain 502-3, however, is shorter. This is visually indicated in FIG. 7 by the void 710. As indicated by the various ellipses, additional retention-relevant storage devices can be included in any given scan chain 502, or additional scan chains may be included as part of the second group 314.

The extraction circuitry 702 applies at least one scan control signal 316 to the multiple retention-relevant storage devices 108-5 to 108-12 of the second group 314. More specifically, the extraction circuitry 702 is configured to pump shift pulses into the multiple scan chains 502-1 to 502-3 to shift the second data out of the multiple scan chains. For example, the extraction circuitry 702 can assert the scan enable signal 610 (of FIG. 6) and oscillate the clock signal 612 to advance the scan data 604 along the scan chains to thereby scan out the second data.

Responsive to each shift pulse, a set of second data is output from the most-rightward column of retention-relevant storage devices. The storage circuitry 704 transfers each set of second data to the memory block 104 to effectuate the data migration serially one column at a time. More specifically, the storage circuitry 704 collects a portion of the second data from each scan chain 502 of the multiple scan chains 502-1 to 502-3 and combines the portion of the second data from each scan chain 502 into a data word 508. The storage circuitry 704 also writes the data word 508 into the memory block 104.

The storage circuitry 704 causes the data word 508 to be stored in the memory block 104 using at least one memory control signal 318. To do so, the storage circuitry 704 determines an address and generates a write enable signal, a column select signal, a clock signal, and so forth to control the memory block 104 to write the data word 508 into the determined address. For any void 710, the storage circuitry 704 generates data padding 708. The first data word 508 to exit the multiple scan chains 502-1 to 502-3 includes the following second data portions: "#y|#z| data padding." As indicated by the arrow 712-1, this data word is transferred to the memory block 104. The arrows 712-1, 712-2, and 712-3 indicate a logical transfer of the second data from the second group 314 to the memory block 104. In a physical implementation, however, the second data is shifted out of the most-rightward, last column in a serial manner.

From the second column, and therefore the second to last data to be shifted out of the multiple scan chains 502-1 to 502-3, the stored data word includes the following second data portions: "#d|#e|#f." This data transfer is indicated by the arrow 712-2. From the first column, and therefore the last data to be shifted out of the multiple scan chains 502-1 to 502-3, the stored data word includes the following second data portions: "#a|#b|#c." This data transfer is indicated by the arrow 712-3. Each stored data word corresponds to the second data extracted from multiple retention-relevant storage devices in a column of the array of retention-relevant storage devices. The data word 508 can be any length. For example, the data word 508 includes 32 bits if each retention-relevant storage device stores one bit and the multiple retention-relevant storage devices are activated into 32 scan chains. As another example, each data word 508 includes 512 bits if each retention-relevant storage device stores eight bits and the multiple retention-relevant storage devices are activated into 64 scan chains.

Figure 8:
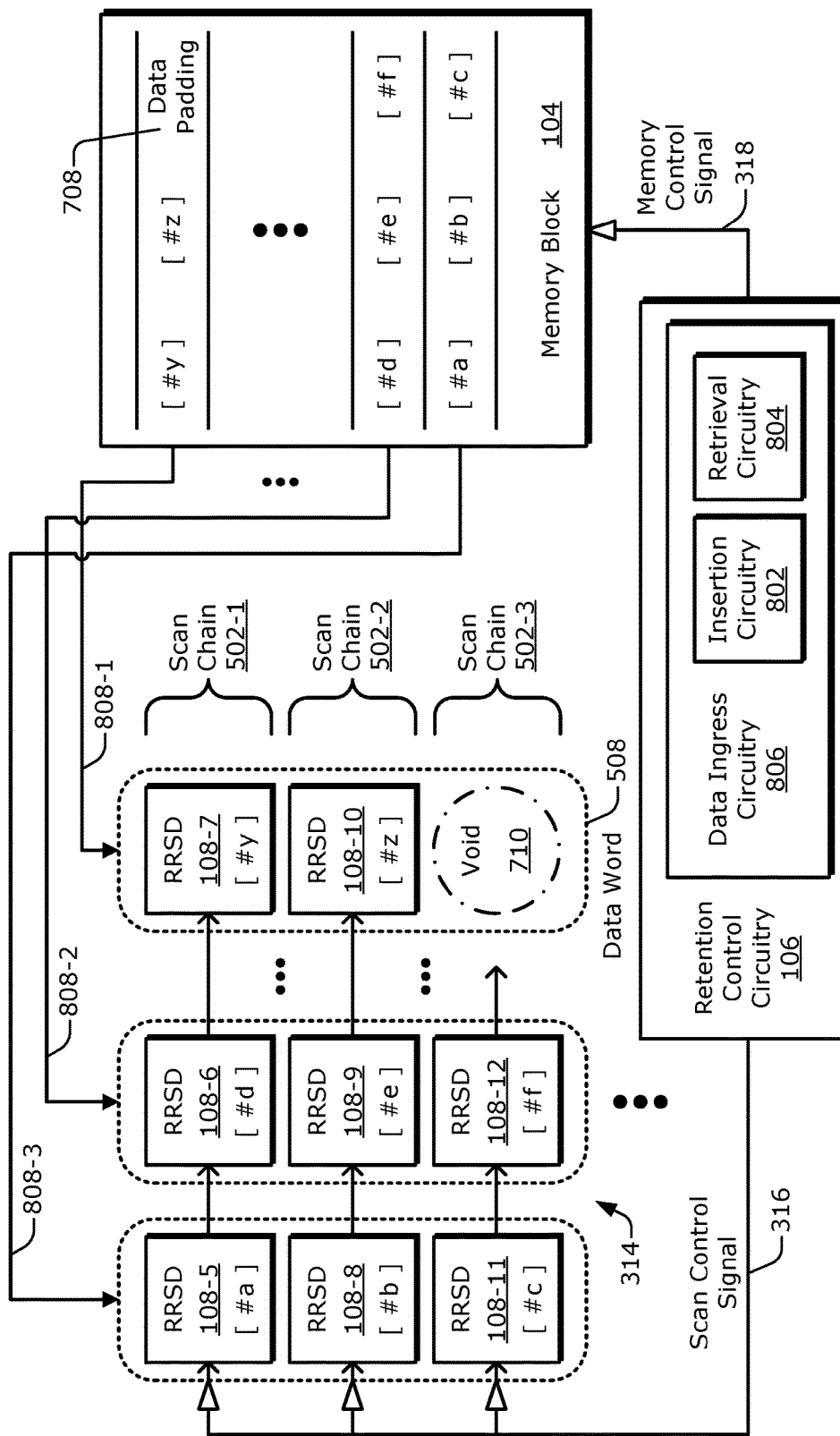
FIG. 8 illustrates an example data ingress migration for a power-up phase in which the retention control circuitry manages a transition from the retention operational mode to the regular operational mode with data migration.

FIG. 8 illustrates an example data ingress migration 308 for a power-up phase (e.g., a power-up transition 116) in which the retention control circuitry 106 manages a transition from the retention operational mode 112 to the regular operational mode 110 by migrating data. The retention control circuitry 106 includes data ingress circuitry 806, which includes insertion circuitry 802 and retrieval circuitry 804. As shown, the second group 314 includes at least eight (8) retention-relevant storage devices that are part of the logic block 102 (e.g., of FIG. 3). The approach 800 depicts an ingress phase of a data migration scheme for the same scenario as is described above with reference to FIG. 7 for an egress phase of a data migration scheme. Together, the ingress phase and the egress phase accommodate transitions between the retention operational mode 112 and the regular operational mode 110.

In operation, the data ingress circuitry 806 migrates the second data of the second group 314 out of the memory block 104 and back to the logic block 102 using a sequence of operations for the power-up transition 116. The retrieval circuitry 804 causes each data word stored in the memory block 104 to be retrieved using at least one memory control signal 318. To do so, the retrieval circuitry 804 determines an address and generates a (de-asserted) write enable signal, a column select signal, a clock signal, and so forth to control the memory block 104 to read the data word 508 from the determined address. By reading from the memory block 104 at the address determined to be storing second data from a logical column formed from multiple scan chains, the data word 508 therefore includes the portion of the second data previously collected from each scan chain 502 of the multiple scan chains 502-1, 502-2, and 502-3.

The insertion circuitry 802 activates the multiple retention-relevant storage devices 108-5 to 108-12 into the three scan chains 502-1, 502-2, and 502-3. The insertion circuitry 802 applies at least one scan control signal 316 to the multiple retention-relevant storage devices 108-5 to 108-12 of the second group 314. More specifically, the insertion circuitry 802 pumps shift pulses into the multiple scan chains 502-1 to 502-3 to shift the second data into the multiple scan chains. For example, the insertion circuitry 802 can assert the scan enable signal 610 (of FIG. 6) and oscillate the clock signal 612 to advance the scan data 604 along the scan chains to thereby scan in the second data.

The retrieval circuitry 804 obtains each word of the second data from the memory block 104. The insertion circuitry 802 couples the second data to the multiple retention-relevant storage devices to effectuate the data migration serially one column at a time. More specifically, the insertion circuitry 802 separates portions of the second data as read from a data word of the memory block 104 and distributes the portions across the multiple scan chains 502-1 to 502-3, starting at the most-leftward, first column of the retention-relevant storage devices. Responsive to each shift pulse, the second data is advanced sequentially along the multiple scan chains 502-1 to 502-3 from left to right. Due to the shifting data, the data padding 708 is eventually scanned out of the scan chains to account for any one or more voids 710 that are present in a given scan chain 502.

For the example of FIG. 8, the first data word 508 to be retrieved from the memory block 104 and routed so as to first enter the multiple scan chains 502-1 to 502-3 includes the following second data portions: "#y|#z|data padding." As indicated by the arrow 808-1, this data word is shifted to the most-rightward, last column in the array. The arrows 808-1, 808-2, and 808-3 indicate a logical transfer of the second data from the memory block 104 to the second group 314. In a physical implementation, however, the second data is input initially at the most leftward column and shifted toward the right in a serial manner.

For the second column, and therefore the second to last data to be shifted into the multiple scan chains 502-1 to 502-3, the retrieved data word includes the following second data portions: "#d|#e|#f." This data transfer is indicated by the arrow 808-2. For the first column, and therefore the last data to be shifted into the multiple scan chains 502-1 to 502-3, the retrieved data word includes the following second data portions: "#a|#b|#c." This data transfer is indicated by the arrow 808-3. Each restored data word corresponds to the second data previously extracted from multiple retention-relevant storage devices in a column of the array of retention-relevant storage devices. In this manner, the second data of the second group 314 is retained during a power collapse event 208 and restored to the appropriate retention-relevant storage devices of the logic block 102 using data migration.

Figure 9:
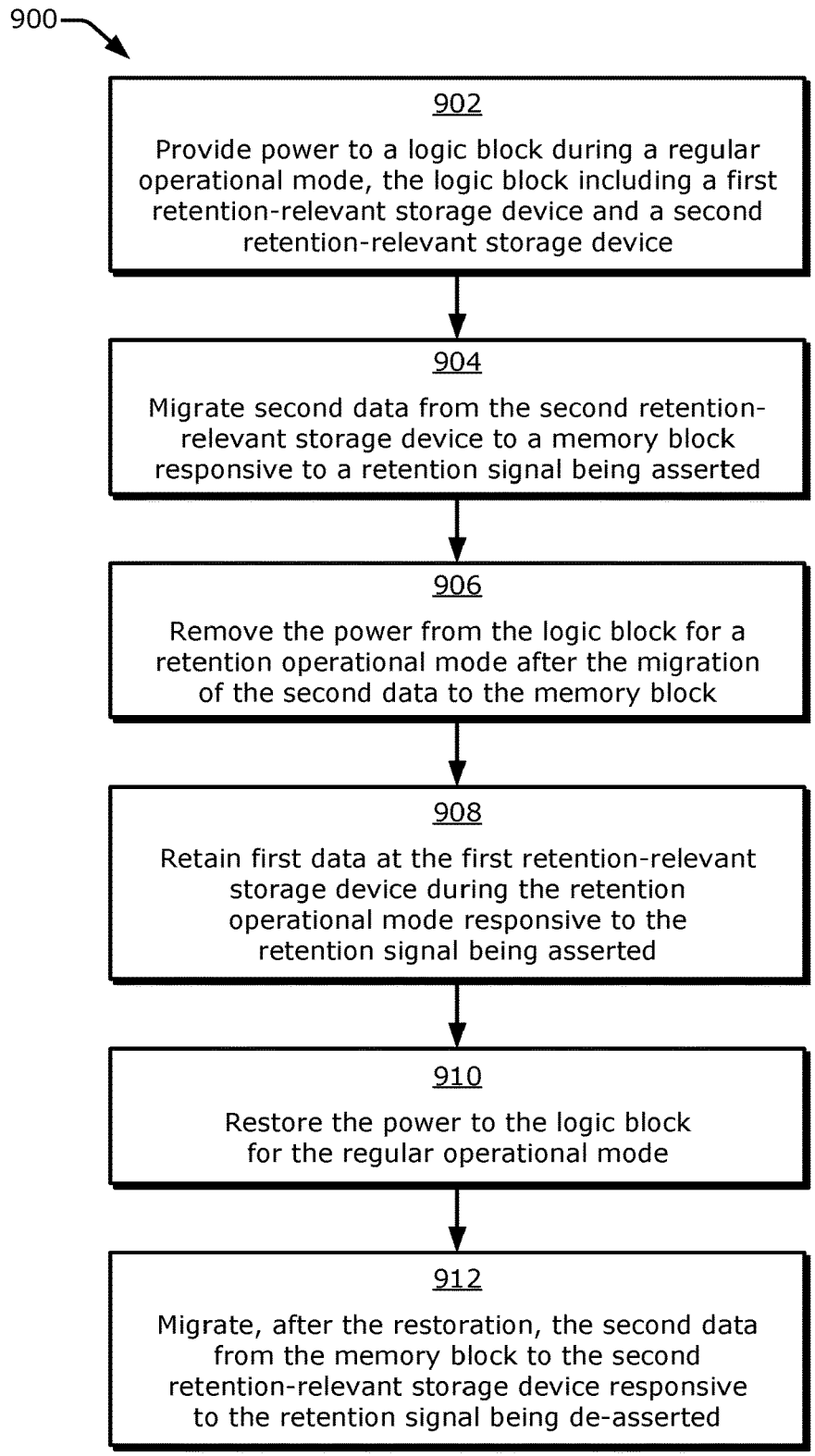
FIG. 9 is a flow diagram illustrating an example process for data retention with data migration.

FIG. 9 is a flow diagram 900 illustrating an example process for data retention with data migration. The process is described in the form of a set of blocks 902-912 that specify operations that can be performed. However, operations are not necessarily limited to the order shown in FIG. 9 or described herein, for the operations may be implemented in alternative orders or in fully or partially overlapping manners. Operations represented by the illustrated blocks of the process may be performed by an integrated circuit, such as the integrated circuit portion 100 (of FIG. 1) or the integrated circuit 1010 (of FIG. 10), which is described below. More specifically, the operations of the process may be performed by the retention control circuitry 106, in conjunction with the logic block 102, the memory block 104, or the power management circuitry 206.

At block 902, power is provided to a logic block during a regular operational mode, with the logic block including a first retention-relevant storage device and a second retention-relevant storage device. For example, an integrated circuit can provide power to a logic block 102 during a regular operational mode 110. The logic block 102 includes a first retention-relevant storage device 108-1 and a second retention-relevant storage device 108-5. Under control of a power management circuitry 206, a power management integrated circuit may provide power to the logic block 102 using a collapsible power rail 210.

At block 904, second data is migrated from the second retention-relevant storage device to a memory block responsive to a retention signal being asserted. For example, the integrated circuit can migrate second data 304-1 from the second retention-relevant storage device 108-5 to a memory block 104 responsive to a retention signal 310 being asserted. This data egress migration 306 may be performed by sequentially scanning second data 304 out of multiple scan chains 502-1 to 502-$m$ that are formed from multiple retention-relevant storage devices of a second group 314, including the second retention-relevant storage device 108-5.

At block 906, the power is removed from the logic block for a retention operational mode after the migrating of the second data to the memory block. For example, the integrated circuit can remove the power from the logic block 102 for a retention operational mode 112 after the migrating of the second data 304-1 to the memory block 104. To do so, the power management circuitry 206 may disconnect the collapsible power rail 210 from a power source by opening at least one switch and thereby causing a power collapse event 208 for a collapsible power domain 202, which includes the logic block 102.

At block 908, first data is retained at the first retention-relevant storage device during the retention operational mode responsive to the retention signal being asserted. For example, the integrated circuit can retain first data 302-1 at the first retention-relevant storage device 108-1 during the retention operational mode 112 responsive to the retention signal 310 being asserted. A retention storage device 402-1, such as a retention flip-flop 404, may retain the first data 302-1 using a local retention mechanism, such as a slave that remains alive during the power collapse event 208.

At block 910, the power is restored to the logic block for the regular operational mode. For example, the integrated circuit can restore the power to the logic block 102 for the regular operational mode 110. The power management circuitry 206 may, for instance, reconnect the collapsible power rail 210 to the power source by closing at least one switch and thereby ending the power collapse event 208 of the collapsible power domain 202 prior to migrating the second data 304 back to the logic block 102.

At block 912, after the power restoration, the second data is migrated from the memory block to the second retention-relevant storage device responsive to the retention signal being de-asserted. For example, the integrated circuit can migrate the second data 304-1 from the memory block 104 to the second retention-relevant storage device 108-5 responsive to the retention signal 310 being de-asserted after the power is restored to the logic block 102. This data ingress migration 308 may be performed by sequentially scanning second data 304 into multiple scan chains 502-1 to 502-$m$ that are formed from multiple retention-relevant storage devices of the second group 314, including the second retention-relevant storage device 108-5.

An example implementation of the egress migration at block 904 includes activating the second retention-relevant storage device 108-5 as part of a scan chain 502-1 and advancing the second data 304-1 along the scan chain 502-1. Another example implementation of the egress migration at block 904 further includes generating a data word 508 by combining the second data 304-1 (e.g., "[#a]") with other data 304 (e.g., "[#b]" and "[#c]") from other scan chains 502-2 and 502-3 and writing the data word 508 into the memory block 104. Implementation of the generating operation can include incorporating data padding 708 into the data word 508 based on relative lengths of one or more scan chains 502 of the other scan chains 502-2 to 502-3 to handle at least one void 710.

In an example implementation, the first retention-relevant storage device 108-1 comprises a retention flip-flop 404. Further, the retaining operation at block 908 can include isolating, for the retention operational mode 112, the first data 302-1 using at least one of a live master portion or a live slave portion of the retention flip-flop 404 (e.g., of a live-master retention flip-flop 408 or a live-slave retention flip-flop 406, respectively). Additionally or alternatively, the retaining operation at block 908 can include sequestering, for the retention operational mode 112, the first data 302-1 in a balloon latch of the retention flip-flop 404 (e.g., of a balloon-latch retention flip-flop 410).

Figure 10:
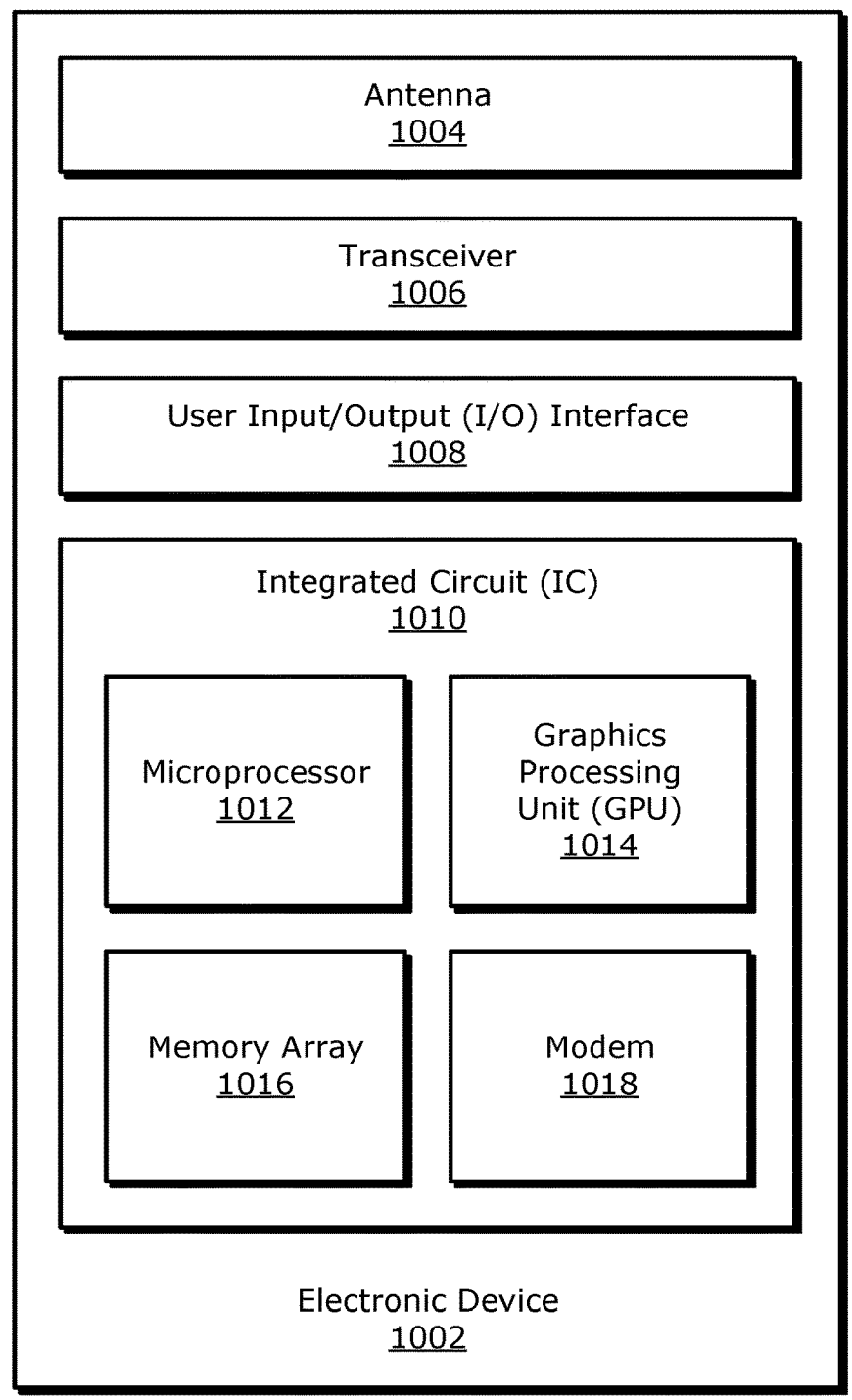
FIG. 10 illustrates an example electronic device that includes an integrated circuit having multiple cores.

FIG. 10 illustrates an example electronic device 1002 that includes an integrated circuit (IC) 1010 having multiple cores. As shown, the electronic device 1002 includes an antenna 1004, a transceiver 1006, and a user input/output (I/O) interface 1008 in addition to the integrated circuit 1010. Illustrated examples of the integrated circuit 1010, or cores thereof, include a microprocessor 1012, a graphics processing unit (GPU) 1014, a memory array 1016, and a modem 1018. In one or more implementations, power management techniques that include a remote retention mechanism as described herein can be implemented by the integrated circuit 1010.

The electronic device 1002 can be a mobile or battery-powered device or a fixed device that is designed to be powered by an electrical grid. Examples of the electronic device 1002 include a server computer, a network switch or router, a blade of a data center, a personal computer, a desktop computer, a notebook or laptop computer, a tablet computer, a smart phone, an entertainment appliance, or a wearable computing device such as a smartwatch, intelligent glasses, or an article of clothing. An electronic device 1002 can also be a device, or a portion thereof, having embedded electronics. Examples of an electronic device 1002 with embedded electronics include a passenger vehicle, industrial equipment, a refrigerator or other home appliance, a drone or other unmanned aerial vehicle (UAV), or a power tool.

For an electronic device with a wireless capability, the electronic device 1002 includes an antenna 1004 that is coupled to a transceiver 1006 to enable reception or transmission of one or more wireless signals. The integrated circuit 1010 may be coupled to the transceiver 1006 to enable the integrated circuit 1010 to have access to received wireless signals or to provide wireless signals for transmission via the antenna 1004. The electronic device 1002 as shown also includes at least one user I/O interface 1008. Examples of the user I/O interface 1008 include a keyboard, a mouse, a microphone, a touch-sensitive screen, a camera, an accelerometer, a haptic mechanism, a speaker, a display screen, or a projector.

The integrated circuit 1010 may comprise, for example, one or more instances of a microprocessor 1012, a GPU 1014, a memory array 1016, a modem 1018, and so forth. The microprocessor 1012 may function as a central processing unit (CPU) or other general-purpose processor. Some microprocessors include different parts, such as multiple processing cores, that may be individually powered on or off. The GPU 1014 may be especially adapted to process visual-related data for display. If visual-related data is not being rendered or otherwise processed, the GPU 1014 may be fully or partially powered down. The memory array 1016 stores data for the microprocessor 1012 or the GPU 1014. Example types of memory for the memory array 1016 include random access memory (RAM), such as dynamic RAM (DRAM) or static RAM (SRAM); flash memory; and so forth. If programs are not accessing data stored in memory, the memory array 1016 may be powered down overall or block-by-block. The modem 1018 demodulates a signal to extract encoded information or modulates a signal to encode information into the signal. If there is no information to decode from an inbound communication or to encode for an outbound communication, the modem 1018 may be idled to reduce power consumption. The integrated circuit 1010 may include additional or alternative parts than those that are shown, such as an I/O interface, a sensor such as an accelerometer, a transceiver or another part of a receiver chain, a customized or hard-coded processor such as an application-specific integrated circuit (ASIC), and so forth.

The integrated circuit 1010 may also comprise a system on a chip (SOC). An SOC may integrate a sufficient number of different types of components to enable the SOC to provide computational functionality as a notebook computer, a mobile phone, or another electronic apparatus using one chip, at least primarily. Components of an SOC, or an integrated circuit 1010 generally, may be termed cores or circuit blocks. A core or circuit block of an SOC may be powered down if not in use, such as by undergoing a power collapse, including when functional data is to be retained using a data migration scheme, according to the techniques described in this document. Examples of cores or circuit blocks include, in addition to those that are illustrated in FIG. 10, a voltage regulator, a main memory or cache memory block, a memory controller, a general-purpose processor, a cryptographic processor, a video or image processor, a vector processor, a radio, an interface or communications subsystem, a wireless controller, or a display controller. Any of these cores or circuit blocks, such as a processing or GPU core, may further include multiple internal cores or circuit blocks.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:
   a logic block including logic circuitry and multiple retention-relevant storage devices, the multiple retention-relevant storage devices configured to store first data and second data, the multiple retention-relevant storage devices including:
      a first group of retention-relevant storage devices, the first group of the retention-relevant storage devices including retention storage devices configured to store the first data and to retain the first data at the retention storage devices during a retention operational mode; and
      a second group of retention-relevant storage devices configured to store the second data while the logic block is powered for a regular operational mode;
   a memory block including memory circuitry and configured to maintain memory data in the memory block during the retention operational mode; and
   retention control circuitry coupled to the logic block and the memory block, the retention control circuitry configured to:
      migrate, using at least one scan chain formed from the second group of the retention-relevant storage devices, the second data from the second group of the retention-relevant storage devices of the logic block to the memory block for the retention operational mode; and
      migrate, using the at least one scan chain formed from the second group of the retention-relevant storage devices, the second data from the memory block to the second group of the retention-relevant storage devices for the regular operational mode.

2. The integrated circuit of claim 1, further comprising:
   a collapsible power domain configured to be powered during the regular operational mode and unpowered during the retention operational mode, the collapsible power domain including the logic block; and
   an always-on power domain configured to be powered during the regular operational mode and during the retention operational mode, the always-on power domain including the memory block.

3. The integrated circuit of claim 2, further comprising:
   power management circuitry configured to power down the collapsible power domain, including the logic block, to cause a power collapse event for the retention operational mode after migration of the second data from the second group of the retention-relevant storage devices of the logic block to the memory block.

4. The integrated circuit of claim 1, further comprising:
   a collapsible power domain configured to be powered during the regular operational mode and unpowered during the retention operational mode, the collapsible power domain including the logic block,
   wherein the memory block comprises a non-volatile memory.

5. The integrated circuit of claim 1, wherein:
   the multiple retention-relevant storage devices comprise multiple retention-relevant flip-flops including the second group and the first group; and
   the first group of the retention-relevant flip-flops includes retention flip-flops configured to retain the first data using a retention mechanism that is local to the retention flip-flops.

6. The integrated circuit of claim 5, wherein the first group of the retention flip-flops includes at least one of a live-slave retention flip-flop, a live-master retention flip-flop, or a balloon-latch retention flip-flop.

7. The integrated circuit of claim 5, wherein the second group of the retention-relevant flip-flops includes flip-flops configured to retain the second data using a retention mechanism that is at least partially remote from the flip-flops and that is based on data migration.

8. The integrated circuit of claim 1, wherein:
   the retention-relevant storage devices of the first group are configured to implement at least one first functionality for the logic block, with the at least one first functionality having a relatively higher latency sensitivity with respect to transitioning from the retention operational mode to the regular operational mode; and the retention-relevant storage devices of the second group are configured to implement at least one second functionality for the logic block, with the at least one second functionality having a relatively lower latency sensitivity with respect to transitioning from the retention operational mode to the regular operational mode.

9. The integrated circuit of claim 8, wherein:
each retention-relevant storage device of the multiple retention-relevant storage devices comprises a storage device configured to store data that is to survive a power collapse by the logic block during the retention operational mode using at least one of a local retention mechanism or a remote retention mechanism; and
the at least one first functionality includes at least one of boot functionality for the logic block or phase-locked loop (PLL) functionality for the logic block.

10. The integrated circuit of claim 1, wherein:
the retention-relevant storage devices of the second group are configured to be activated into multiple scan chains, including the at least one scan chain; and
the retention control circuitry is configured to migrate the second data using the multiple scan chains.

11. The integrated circuit of claim 10, wherein the retention control circuitry is configured to organize the retention-relevant storage devices of the second group into a logical grid having multiple rows and multiple columns, each scan chain of the multiple scan chains corresponding to a row of the multiple rows, a scan chain of the multiple scan chains configured to pass second data sequentially from one retention-relevant storage device to a consecutive retention-relevant storage device along the scan chain.

12. The integrated circuit of claim 10, wherein the retention control circuitry is configured to pump shift pulses into the multiple scan chains to shift the second data out of the multiple scan chains.

13. The integrated circuit of claim 12, wherein, for a power-down phase to transition from the regular operational mode to the retention operational mode, the retention control circuitry is configured to:
collect a portion of the second data from each scan chain of the multiple scan chains;
combine the portion of the second data from each scan chain into a data word; and
write the data word into the memory block.

14. The integrated circuit of claim 13, wherein, for a power-up phase to transition from the retention operational mode to the regular operational mode, the retention control circuitry is configured to:
read the data word from the memory block, the data word including the portion of the second data collected from each scan chain of the multiple scan chains; and
distribute across the multiple scan chains the portion of the second data as read from the memory block.

15. The integrated circuit of claim 13, wherein the retention control circuitry is configured to:
combine the portion of the second data from each scan chain into a data word by incorporating data padding into the data word based on relative lengths of one or more scan chains of the multiple scan chains.

16. The integrated circuit of claim 1, wherein the integrated circuit comprises a system on a chip (SOC).

17. The integrated circuit of claim 16, wherein the logic block comprises at least one of a microprocessor, a graphics processing unit (GPU), or a modem.

18. The integrated circuit of claim 1, wherein the retention storage devices of the first group of the retention-relevant storage devices are configured to store the first data at the retention storage devices during the regular operational mode.

19. An integrated circuit comprising:
a logic block including logic circuitry and multiple retention-relevant storage devices, the multiple retention-relevant storage devices configured to store first data and second data, the multiple retention-relevant storage devices including:
a first group of retention-relevant storage devices, the first group of the retention-relevant storage devices including retention storage devices configured to store the first data during a regular operational mode and to retain the first data at the retention storage devices during a retention operational mode; and
a second group of retention-relevant storage devices configured to store the second data while the logic block is powered for the regular operational mode;
a memory block including memory circuitry and configured to maintain memory data in the memory block during the retention operational mode; and
retention control means for migrating, using at least one scan chain activated from the second group of the retention-relevant storage devices, the second data from the second group of the retention-relevant storage devices of the logic block to the memory block to accommodate a transition from the regular operational mode to the retention operational mode and for migrating, using the at least one scan chain activated from the second group of the retention-relevant storage devices, the second data from the memory block to the second group of the retention-relevant storage devices of the logic block to accommodate a transition from the retention operational mode to the regular operational mode.

20. The integrated circuit of claim 19, wherein:
each respective retention storage device of the first group of the retention-relevant storage devices comprises means for retaining a bit of the first data at the respective retention storage device; and
each respective retention-relevant storage device of the second group of the retention-relevant storage devices comprises means for storing a bit of the second data at the respective retention-relevant storage device.

21. The integrated circuit of claim 19, further comprising:
scan chain means for activating the second group of the retention-relevant storage devices into multiple scan chains configured to be accessed serially, the multiple scan chains including the at least one scan chain.

22. The integrated circuit of claim 19, wherein the retention control means comprises data egress means for migrating the second data from the second group of the retention-relevant storage devices of the logic block to the memory block to accommodate the transition from the regular operational mode to the retention operational mode.

23. The integrated circuit of claim 22, wherein the data egress means comprises:
extraction means for scanning the second data out of the at least one scan chain activated from the second group of the retention-relevant storage devices; and
storage means for writing the second data into the memory block.

24. The integrated circuit of claim 19, wherein the retention control means comprises data ingress means for migrating the second data from the memory block to the second group of the retention-relevant storage devices of the logic block to accommodate the transition from the retention operational mode to the regular operational mode.

25. The integrated circuit of claim 24, wherein the data ingress means comprises:
   retrieval means for reading the second data from the memory block; and
   insertion means for scanning the second data into the at least one scan chain activated from the second group of the retention-relevant storage devices.

\* \* \* \* \*